United States Patent [19]
Chang et al.

[11] Patent Number: 5,097,144
[45] Date of Patent: Mar. 17, 1992

[54] DRIVER CIRCUIT FOR TESTING BI-DIRECTIONAL TRANSCEIVER SEMICONDUCTOR PRODUCTS

[75] Inventors: Albert Y. Chang, Poughkeepsie; Algirdas J. Gruodis, Wappingers Falls; Dale E. Hoffman, Stormville; Daniel E. Skooglund, Wappingers Falls, all of N.Y.

[73] Assignee: International Business Machines Corporation, Armonk, N.Y.

[21] Appl. No.: 516,612

[22] Filed: Apr. 30, 1990

[51] Int. Cl.$^5$ .............................. H03K 3/01
[52] U.S. Cl. .................... 307/270; 307/455; 307/475; 307/494; 307/254
[58] Field of Search ............ 307/270, 443, 454, 455, 307/473, 475, 491, 494, 254, 355

[56] References Cited

U.S. PATENT DOCUMENTS

| | | | |
|---|---|---|---|
| 3,686,515 | 8/1972 | Kadono | 307/254 |
| 4,013,898 | 3/1977 | Makino | 307/299.3 |
| 4,038,567 | 7/1977 | Lewis et al. | 307/475 |
| 4,506,171 | 3/1985 | Evans et al. | 307/494 |
| 4,518,876 | 5/1985 | Constantinescu | 307/475 |
| 4,593,211 | 6/1986 | Belforte | 307/475 |
| 4,694,204 | 9/1987 | Nishijima et al. | 307/494 |
| 4,739,194 | 4/1988 | Glasby et al. | 307/475 |
| 4,795,916 | 1/1989 | Liron | 307/270 |
| 4,823,028 | 4/1989 | Lloyd | 307/443 |
| 4,868,423 | 9/1989 | Abdi | 307/443 |

FOREIGN PATENT DOCUMENTS 0226887 12/1986 European Pat. Off. .

Primary Examiner—Stanley D. Miller
Assistant Examiner—Terry D. Cunningham
Attorney, Agent, or Firm—Charles W. Peterson, Jr.

[57] ABSTRACT

A driver circuit is disclosed for use in testing bi-directional transceiver semiconductor products using a minimum of time and number of product accessing pins. The driver includes a pair of controllable amplitude current sources whose output currents are selectably switched into or partially away from the commonly connected emitters of a current switch. The current switch is energized by a variable voltage source and produces the output test voltage.

6 Claims, 2 Drawing Sheets

DRIVER CIRCUIT FOR TESTING BI-DIRECTIONAL TRANSCEIVER SEMICONDUCTOR PRODUCTS

BACKGROUND OF THE INVENTION

1. Field of the Invention

The present invention relates to testing systems, and more particularly, to a driver circuit for use in testing bidirectional semiconductor devices.

2. Description of the Related Art

Testing systems for semiconductor logic and array products must meet ever increasing demands as product circuit complexities, operating speeds and pin count requirements continue to burgeon. Faster product operating speeds correspondingly require that the testers operate at higher data rates. Greater product circuit complexity calls for increased test pattern generator flexibility and sophistication. Product pin availability restrictions create the need for increased functionality of a pin to operate as an input and/or output, which requires that the testers be adapted to access product circuits (i.e., to apply test signals and to extract circuit responses thereto) without sacrificing performance.

One known technique to limit the number of pins on high density product circuits involves the use of common input-output (I/O) circuit terminal pins, to permit bi-directional communication at different times. When testing such products, test signals are applied and the circuit response thereto is received at mutually exclusive times using the same pin. Other products extend the common I/O technique by enabling the simultaneous bidirectional communication of data between chips over the same interchip cable path using a single circuit accessing pin on each chip. One example of such a simultaneous bi-directional transceiver circuit is described in U.S. Pat. No. 4,690,800, issued on Oct. 6, 1987 to Joseph R. Cavaliere et al, and assigned to the present assignee.

As explained in the cited patent, each transceiver circuit receives an input bilevel data signal and a trilevel signal from one end of the interchip cable and produces an output bilevel data signal therefrom representing the data (if any) being transmitted simultaneously from a second transceiver circuit connected to the opposite end of the interchip cable. Thus, in order to test ordinary bidirectional receivers (common I/O), bilevel test signals are required from the tester whereas trilevel test signals are needed from the tester to test simultaneous bi-directional transceivers (Si-Bi-Di).

It should be noted that each nominal level of the bilevel or trilevel test signals must be individually adjustable during the test to assure that the product voltage level response is within acceptable tolerance limits. Moreover, voltage level changes must be produced by the tester after extremely short intervals so that overall testing time is kept to an acceptable minimum, and the product being tested is characterized at its maximum cycle time regardless of how the pin is configured.

SUMMARY OF THE INVENTION

One object of the present invention is to provide a driver for use in the high speed testing of transceiver circuits of the common I/O or simultaneous bi- directional types.

Another object is to provide a driver capable of producing a trilevel output voltage having signal swing amplitudes and discrete voltage level values which are controllably variable at high speeds.

A further object is to provide a driver for the high speed testing of common I/O or Si-Bi-Di product circuits using test current magnitudes only fractionally above those used in normal product operation.

In accordance with a preferred embodiment of the present invention, a trilevel voltage suitable for high speed bidirectional circuit testing is generated by a driver circuit comprising a pair of jointly controllable amplitude current sources whose output currents can be selectably switched into or partially away from the commonly connected emitters of a current switch. The current switch is energized by a variable voltage source. One side of the current switch produces the output trilevel test voltage when connected by cable to a device under test (DUT). The signal swing amplitude of the test voltage may be varied by controlling the amplitudes of the aforesaid current sources. The discrete voltage level values of the test voltage may be varied by controlling the amplitude of the aforesaid variable voltage source. The speed with which the transitions are made between levels of the trilevel voltage is governed by the speed with which the current sources are switched into the commonly connected emitters of the current switch.

In one embodiment, the invention comprises: a driver circuit for high speed bidirectional circuit testing, a pair of controllable current sources, a first current switch having first and second outputs and commonly connected current emitting electrodes, a second current switch having first and second outputs and commonly connected emitting electrodes, one of said current sources being coupled to said electrodes of said second switch, the other of said current sources being connected to said electrodes of said first switch, one output of said first switch being connected to said electrodes of said second switch, one of said outputs of said second switch providing the output signal from said driver, input data means connected to said second switch for actuating said second switch, a source of variable voltage for powering said second switch, and means for actuating said first switch.

BRIEF DESCRIPTION OF THE DRAWING

FIG. 4 is a schematic diagram of an alternate embodiment of the present invention.

DESCRIPTION OF THE PREFERRED EMBODIMENT

Figure 1:
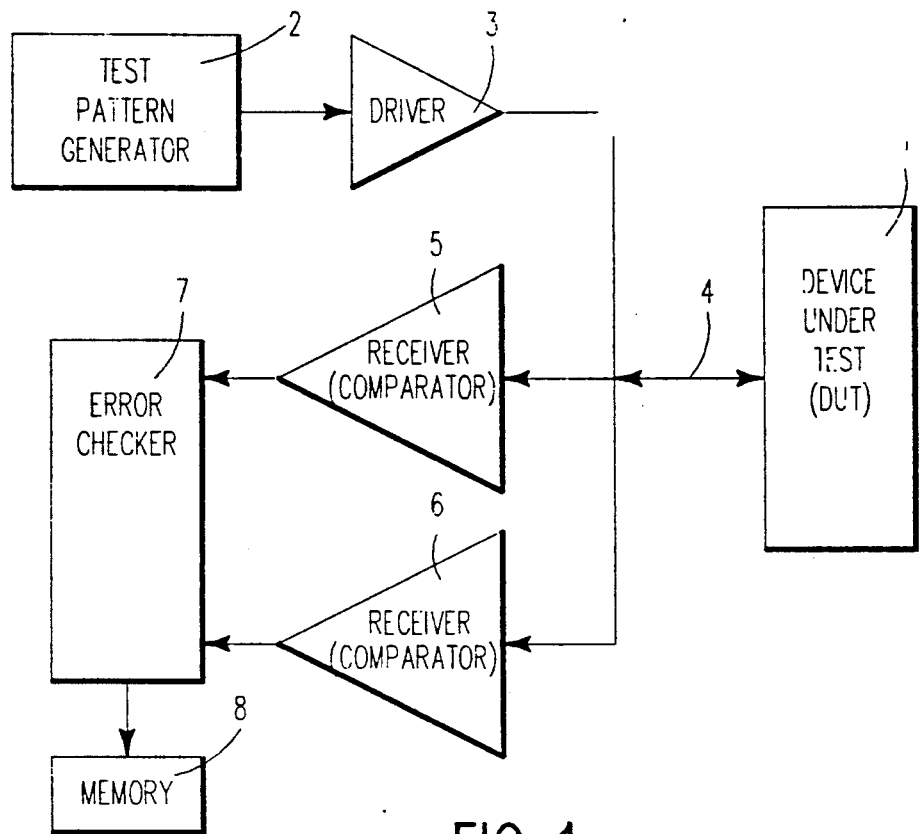
FIG. 1 is a simplified block diagram of a test system in which the driver of the present invention is to be employed.

Referring to FIG. 1, a bidirectional device to be tested ("device under test" or "DUT") is represented by the numeral 1. The DUT may have either a common I/O logic pin or a simultaneous bi-directional (Si-Bi-Di) pin as previously defined. The test signal patterns are provided by generator 2 and applied via driver 3 to the DUT. Driver 3 will be described in detail with FIGS. 2 and 3 in accordance with the preferred embodiment of the present invention. The response signature of the DUT is manifested by the returning signal on line 4 which is coupled to receiver-comparators 5 and 6 which detect the DUT response. The actual responses and the expected DUT responses (assuming good product) are analyzed by error checker 7 and stored in memory 8.

Si-Bi-Di Type Device

As suggested by the double-headed arrow on line 4, signals may flow from driver 3 to DUT 1 (test signals) or from DUT 1 to driver 3 (test response signals). The voltage level on line 4 is determined by the simultaneous conditions of driver 3 (tester driver "high" or "low") and DUT 1 (Si-Bi-Di drive "high" or "low"). Three voltage levels indicate the status of the two drivers as follows:

| Line 4 | Driver 3 | DUT 1 |
| --- | --- | --- |
| High | High | High |
| Low | Low | Low |
| Middle | High | Low |
| Middle | Low | High |

Common I/O Type Device

This case is similar except that communication on line 4 is only in one direction during a test cycle. The status of the drivers is as follows:

| Line 4 | Driver 3 | DUT 1 |
| --- | --- | --- |
| Low | Middle | Low |
| High | Middle | High |
| Low | Low | Tristate |
| High | High | Tristate |

Test pattern generator 2 provides a pattern of test data signals in binary form to exercise the DUT. Driver 3 receives the test data signals and converts them into trilevel form for simultaneous bidirectional communication with the DUT. The signal conversion is accomplished with the aid of the apparatus broadly outlined in FIG. 2 and shown in detail in FIG. 3, to test a Si-Bi-Di circuit such as that described in U.S. Pat. No. 4,690,800.

Figure 2:
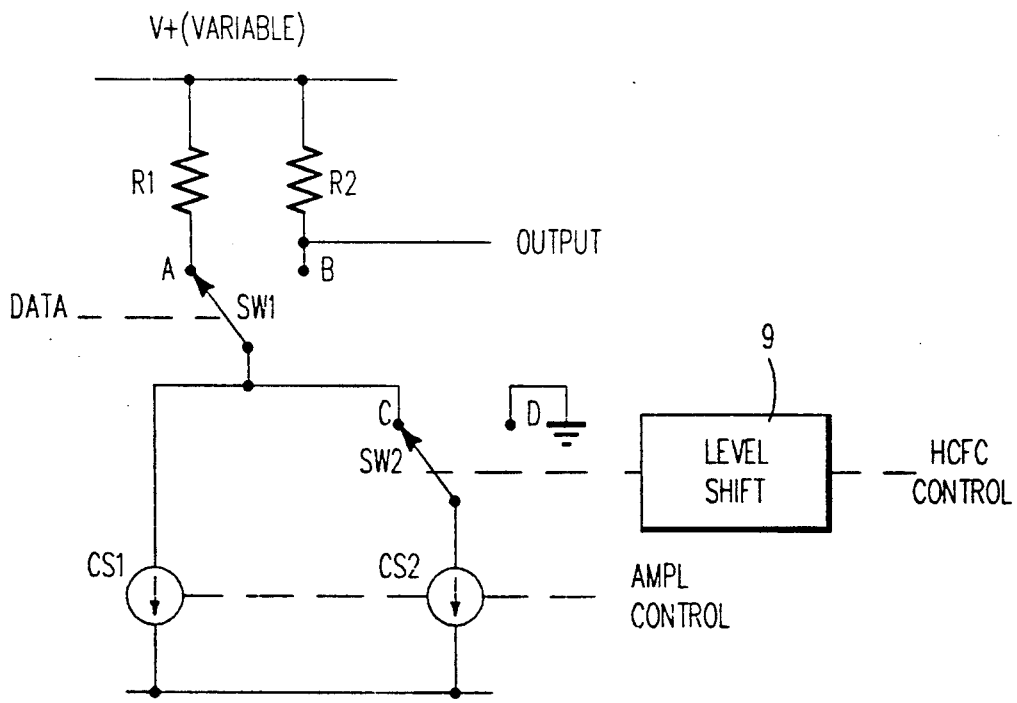
FIG. 2 is a simplified block diagram of the driver of FIG. 1.
Figure 3:
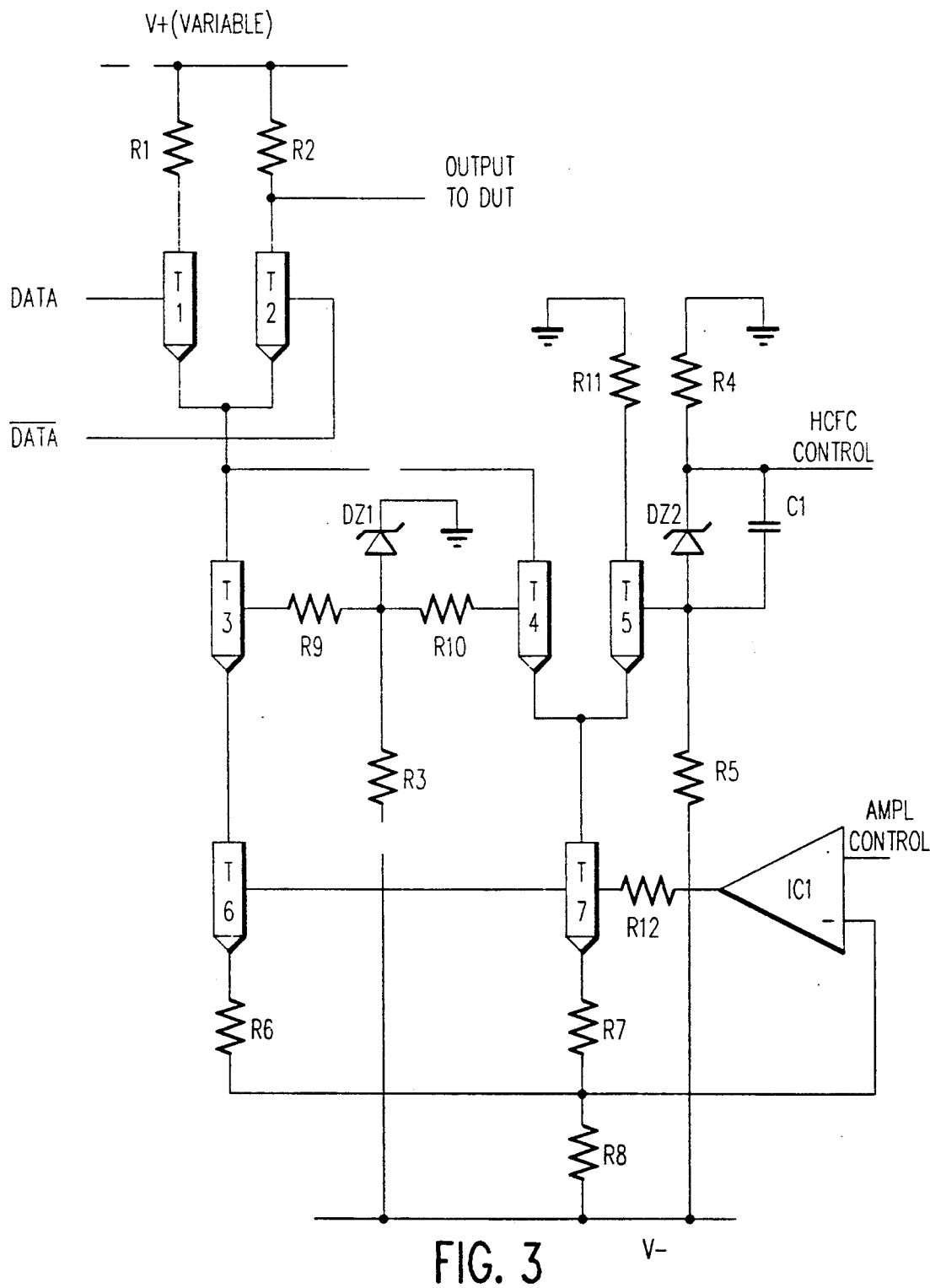
FIG. 3 is a schematic diagram of a preferred embodiment of the present invention.

Transistors T6 and T7 of FIG. 3 along with resistors R6, R7 and R12 and operational amplifier IC1 form two variable current sources with a common control, AMPL CONTROL. The common control is the preferred embodiment; however, independent control can also be used for increased flexibility. The control voltage AMPL CONTROL is applied to the non-inverting input of IC1. The inverting input of IC1 is forced to this voltage due to the high gain of the op amp IC1 and the upper node of R8 is forced to the same voltage. If this voltage is greater than V − (a fixed voltage supply), current flows down through R8. This current splits up between resistors R6 and R7 and flows out of the emitters of transistors T6 and T7. Since the current is flowing in the direction to turn on T6 and T7, their bases will rise to establish the correct $V_{BE}$ for such current and the output of IC1 will settle at the base voltage. The current in the current sources is varied by changing the control voltage, AMPL CONTROL. R6 and R7 are used to compensate for mismatches between T6 and T7 so that the current in R8 will split up equally between T6 and T7. These resistors reduce the slope of the current-voltage relationship between the inverting terminal and output of IC1. For a fixed voltage across the inverting terminal and the output of IC1, the variation of emitter current due to T6-T7 mismatch is reduced. R 12 is used to prevent the op amp IC1 from oscillating. The two current sources are shown in FIG. 2 as CS1 and CS2 with the upper connections of CS1 and CS2 equivalent to the collectors of T6 and T7 of FIG. 3. FIG. 4 is a schematic diagram of an alternate embodiment of the present invention.

The driver circuit further comprises transistors T3, T4 and T5, resistors R3, R4, R5, R9, R10 and R11, zener diodes DZ1 and DZ2 and capacitor C1. T4 and T5 form a differential pair that is used as a current switch to switch the T7 collector current to the T1-T2 circuit or to ground through R11. The control for this switch is HCFC CONTROL which is a high speed signal. This signal is level shifted by zener diode DZ2, and applied to one input of the differential pair. The other differential pair input is a reference voltage generated by zener diode DZ1 and biasing resistor R3. The side of the differential pair that is higher in voltage will turn on and all of the T7 collector current will flow through the "on" side. The reference voltage is set so that T3 and T4 do not saturate. T3 is used to isolate the emitters of T1 and T2 from the capacitance of the long length of the conductor necessary to connect T6 to T1 and T2. The long length becomes apparent when the circuit is physically laid out.

Resistors R9 and R10 isolate T3 and T4 from each other and prevent them from oscillating. R11 is also used for isolation and prevents T5 from oscillating. The HCFC input is level shifted and terminated by the circuit of DZ2, R4, R5 and C1. The HCFC CONTROL input switches between two voltages. Zener diode DZ2 shifts this signal down so that it is centered around the reference voltage. Capacitor C1 bypasses DZ2 so the ac portion of the signal passes through C1 and not DZ2 which has poor high frequency response. Resistors R4 and R5 set the input impedance for HCFC CONTROL and also set the Thevenin voltage for this input. This input impedance and voltage are necessary for the correct operation of the circuit (not shown) which generates the HCFC signal. The current switch is shown as SW2 in FIG. 2 with the level shifting circuitry shown as block 9.

The remainder of the driver circuit comprises differential pair T1 and T2, resistors R1 and R2 and variable voltage V +. This differential pair is also used as a current switch. If DATA is lower in voltage than $\overline{\text{DATA}}$, T2 will turn on and all the current coming from the current sources will be switched through R2. This will create a voltage drop in R2 and OUTPUT will go to the low state which is equal to V + minus the voltage drop. The collector of T1 will be at V + since there is no current in T1 and thus no voltage drop across R1. If DATA is higher than $\overline{\text{DATA}}$, T1 will turn on and OUTPUT will go to the high state which is equal to V+. The OUTPUT levels can be offset by moving the variable supply V+ and the OUTPUT swing amplitude can be varied by moving AMPL CONTROL which changes the current source currents and thus changes the voltage drop across resistors R1 and R2. This differential pair is shown in FIG. 2 as SW1. It should be noted that all three levels of the OUTPUT are individually controllable if desired by providing individual operational amplifiers with respective AMPL CONTROLS for transistors T6 and T7 instead of the common AMPL CONTROL shown. Use of the two current sources CS1 and CS2 of FIG. 2 avoids the presence of currents in the DUT during testing that would violate its normal use current limitations.

The alternate embodiment circuit of FIG. 4 operates almost identically to the preferred embodiment of FIG. 3, except that the input data which actuates switch 1, T1 and T2, is a single data input, DATA, at the base of T1 which switches about reference voltage VREF at the base of T2. Operation of the circuit of FIG. 4 can be understood from the description of the operation of FIG. 3 above by replacing $\overline{\text{DATA}}$ with VREF.

What is claimed is:

1. A driver circuit for high speed bidirectional circuit testing comprising:
    a pair of controllable amplitude current sources;
    a first current switch having first and second outputs and commonly connected current emitting electrodes;
    a second current switch having first and second outputs and commonly connected current emitting electrodes;
    one of said current sources being coupled to said commonly connected current emitting electrodes of said first switch;
    the other of said current sources being directly connected to said commonly connected current emitting electrodes of said second switch;
    one said output of said second switch being connected to said commonly connected current emitting electrodes of said first switch and the other said output being coupled to a reference voltage;
    one of said outputs of said first switch providing the output signal from said driver;
    input data means connected to said first switch for actuating said first switch;
    the outputs of said first current switch being coupled to a source of variable voltage; and
    means for actuating said second switch including a zener diode and a high frequency signal bypass means in shunt with said diode connected to an input of said second switch.

2. The driver circuit defined in claim 1 wherein said one of said current sources is coupled to said electrodes of said first switch via a collector-emitter current path of a transistor.

3. The driver circuit defined in claim 1 wherein said second switch comprises a pair of transistors with a common emitter connection, a collector connected to each said output, and, said means for actuating said second switch further comprises bias means connected to a first base of said pair of transistors and said input of said second switch connected to a second base of said pair of transistors.

4. The driver circuit defined in claim 1 wherein said first switch is a pair of transistors with a common emitter connection, a collector connected to each said output and said data means comprises complementary data signal sources respectively connected to a pair of bases of said pair of transistors.

5. The driver circuit defined in claim 1 wherein said first switch comprises a pair of transistors with a common emitter connection, a collector connected to each said output, and said input data means for actuating said first switch comprises bias means connected to a first base of said pair of transistors and data switching means connected to a second base of said pair of transistors.

6. The driver circuit defined in claim 1 further comprising means for controlling said current sources.

* * * * *